United States Patent
Jan et al.

[11] Patent Number: 6,114,722
[45] Date of Patent: *Sep. 5, 2000

[54] MICROCRYSTALLINE SILICON STRUCTURE AND FABRICATION PROCESS

[75] Inventors: Chia-Hong Jan; Sean F. Corcoran, both of Portland, Oreg.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/916,016

[22] Filed: Aug. 21, 1997

Related U.S. Application Data

[63] Continuation of application No. 08/537,141, Sep. 29, 1995, abandoned.

[51] Int. Cl.⁷ ................................................ H01L 29/788
[52] U.S. Cl. ........................... 257/315; 257/316; 257/617
[58] Field of Search ............................... 257/316, 66, 75, 257/315, 617, 517; 437/233, 109

[56] References Cited

U.S. PATENT DOCUMENTS

| | | | |
|---|---|---|---|
| 4,249,962 | 2/1981 | Celler | 257/617 |
| 4,433,469 | 2/1984 | Goodman | 29/571 |
| 4,467,519 | 8/1984 | Glang et al. | 257/517 |
| 4,498,092 | 2/1985 | Yamazaki | 257/64 |
| 4,656,021 | 4/1987 | Tanabe et al. | |
| 4,818,564 | 4/1989 | Ishihara et al. | |
| 4,980,303 | 12/1990 | Yamauchi | |
| 5,017,308 | 5/1991 | Iijima et al. | |
| 5,093,700 | 3/1992 | Sakata | 357/23 |
| 5,147,813 | 9/1992 | Woo | 437/43 |
| 5,184,200 | 2/1993 | Yamanobe | 257/64 |
| 5,274,602 | 12/1993 | Glenn | 257/315 |
| 5,290,712 | 3/1994 | Sato et al. | 437/24 |
| 5,313,077 | 5/1994 | Yamazaki | |
| 5,429,971 | 7/1995 | Yang | 437/43 |
| 5,445,982 | 8/1995 | Hwang | 437/43 |
| 5,473,168 | 12/1995 | Kawai et al. | 257/64 |
| 5,557,122 | 9/1996 | Shrivastava et al. | |
| 5,676,765 | 10/1997 | Saito et al. | |

FOREIGN PATENT DOCUMENTS

| | | |
|---|---|---|
| 61-251172 | 11/1986 | Japan. |
| 4-102372 | 4/1992 | Japan. |
| WO 94/01892 | 1/1994 | WIPO. |

OTHER PUBLICATIONS

"Photoconductivity in doped microcrystalline Si:H,Cl films" Vicenzo Augelli, Teresa Ligonzo, Roberto Murri, and Luigi Schiavulli; J.Appl. Phys. 59(8), Apr. 15, 1986 American Istitute of Physics pp. 2863–2865.

"Correlations between plasma parameters and the deposition of microcrystalline silicon films by plasma of argon and hydrogen" R. Avni and U. Carmi; J.Appl. Phys. 62(5) Sep. 1, 1987 American Insitute of Physics pp. 2044–2049

Electrical conductivity in microcrystalline Si:H:Cl Films; E. Grossman, M. Polak and A. Grill Solar Energy Materials 13 (1986) pp. 433–441.

"Fast Deposition of Amorphous and Microcystalline Silicon Films form SiH2 Cl2 SiH4 H2 by Plasma Enhanced chemical Vapor Deposition", Takeshi Arai, Takuya Nakamura and Hajime.

Shirai; Jpm J. Appl. Phys. vol. 36 (1997) pp. 4907–4910 Part 1, No. 7B July 1997.

Selective epitaxial growth by UHV–CVD using Si2H6 and Cl2; Toru Tatsui, Ken–ichi Aktagawa, Masayuki Hiroi and Junro Sakai Microelectonics Laboratories, NEC Corporation, Elsevier Science Publisher BV 1992.

*Primary Examiner*—Sara Crane
*Attorney, Agent, or Firm*—David J. Kaplan

[57] ABSTRACT

A film primarily comprising silicon crystal grains having a random crystal structure. The average size of the grains is within the range of approximately 50 Å to 500 Å.

1 Claim, 5 Drawing Sheets

MICROCRYSTALLINE SILICON STRUCTURE AND FABRICATION PROCESS

This is a continuation of application Ser. No. 08/537,141, filed Sep. 29, 1995 now abandoned.

FIELD OF THE INVENTION

The present invention relates to semiconductor processing and more particularly to a microcrystalline silicon film and its method of fabrication.

BACKGROUND OF THE INVENTION

As the demand for cheaper, faster, lower power consuming microprocessors increases, so must the device packing density of the integrated circuit (IC). Very Large Scale Integration (VLSI) techniques have continually evolved to meet the increasing demand. The ability to place more IC devices on a semiconductor chip allows more complex and sophisticated functionality to be incorporated into the chip. Therefore, as a result of reducing the dimensions of an IC, products which use such IC's, such as, for example, home computers, will be able to operate faster and with greater functionality than ever before.

Minimizing transistor dimensions involves, among other things, minimizing the width which a photolithographic technology can resolve. Resolution of an image onto a photo-sensitive film is frustrated by even subtle variations in the film's topography, causing the image to shift in and out of focus across the surface of the film. Therefore, it is extremely important that the surface of the photo-sensitive film be as flat, or planar, as possible to avoid problems associated with optical imaging.

In a typical IC device manufacturing process, thick dielectric layers are formed over component features on a semiconductor substrate to insulate these components from electrical interconnects which are subsequently formed over the surface of the dielectric layer. For the dielectric layer to reliably insulate the underlying components of the semiconductor substrate, the aspect ratios of gaps in the underlying substrate must be kept low enough to prevent the formation of, for example, voids or other problems associated with step coverage.

Maximizing the speed at which an IC device operates not only requires the minimization of device dimensions but also the consideration of other electrical characteristics of the device. For example, one way to increase the speed at which a transistor operates is to reduce the resistance of the transistor gate electrode near the electrode/gate oxide interface. For IC technologies in which polycrystalline silicon (polysilicon) is the material used as the gate electrode of a transistor, minimizing the resistance of the polysilicon near the gate oxide interface involves maximizing the dopant concentration of the polysilicon in this region.

Figure 1:
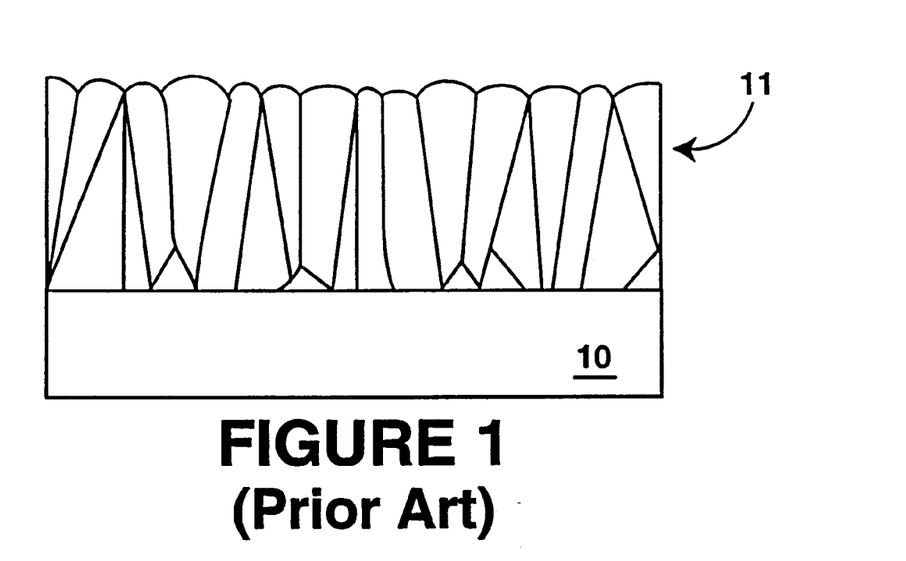
FIG. 1 is a magnified cross-section of a first polysilicon film formed on a substrate.

FIG. 1 shows a magnified cross-section of a polysilicon film 11 formed on substrate 10. Polysilicon film 11 is formed by depositing silicon onto the surface of substrate 10 in a low pressure chemical vapor deposition (LPCVD) chamber at a temperature of approximately 600° C. using silane (SiH$_4$) chemistry. Note the pronounced surface roughness on polysilicon film 11. The surface roughness of polysilicon film 11 is a result of the large-grained columnar crystal structures within the film. This pronounced surface roughness makes it difficult to obtain good patterning profiles due to the significant variation in inter-granular thickness of photoresist formed on the surface of the polysilicon film and the non-uniform reflectivity which occurs during the photolithographic patterning process. This results in poor edge definition for sub-half micron polysilicon lines. Therefore, the polysilicon film of FIG. 1 is not suitable for forming very narrow polysilicon lines such as those used to form polysilicon transistor gate electrodes because the rough surface topography of the polysilicon film frustrates the photolithographic process.

In addition to the difficulties in defining line widths using the polysilicon film shown in FIG. 1, this polysilicon film is prone to severe implant channeling. Implant channeling occurs in a polysilicon film when implanted dopant species enters the film either along a grain boundary or through a silicon crystal channel. The dopant species is projected straight through the polysilicon film and becomes imbedded into the underlying substrate. For applications in which the polysilicon film of FIG. 1 is implemented as the gate electrode as a transistor, this underlying substrate is an ultra thin, highly delicate gate oxide film. Dopant species, which channel through the polysilicon film and become embedded into the gate oxide film have the effect of degrading the quality of the gate oxide film, thereby reducing the reliability and performance of the transistor.

Figure 2:
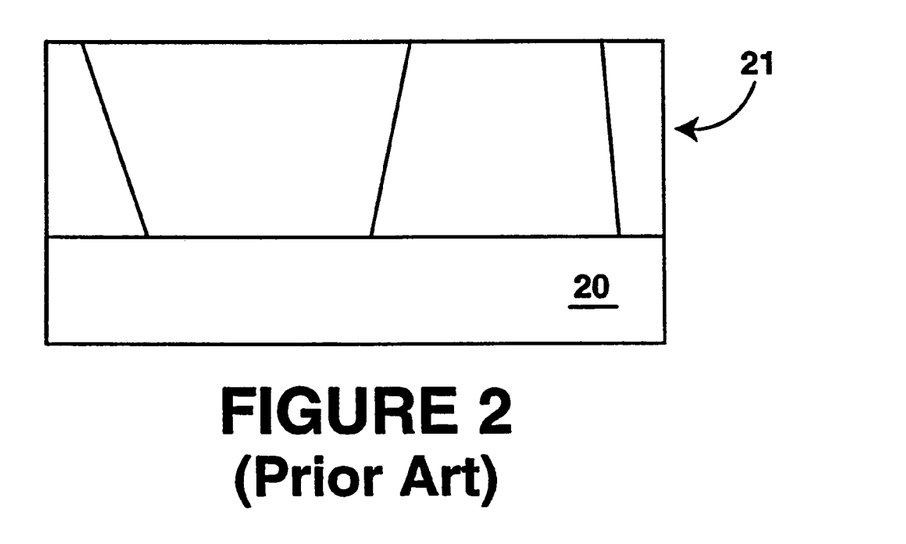
FIG. 2 is a magnified cross-section of a second polysilicon film formed on a substrate.

FIG. 2 shows a magnified cross-section of another polysilicon film 21 formed on substrate 20. Polysilicon film 21 is formed by a process in which silicon is deposited on the surface of a substrate in a LPCVD chamber at a temperature of approximately 550° C. By depositing silicon at this lower temperature, an amorphous silicon film is created because crystal grains cannot develop at this low temperature. This amorphous silicon film is subsequently recrystallized by exposing the material to a temperature in excess of 600° C. The result is the polycrystalline structure shown in FIG. 2 wherein large crystal grains are formed.

While the polysilicon film 21 of FIG. 2 overcomes the problems associated with surface roughness described above, polysilicon film 21 is highly prone to implant channeling. As discussed above, implant channeling degrades the performance and reliability of transistors. In addition, polysilicon film 21 suffers from poly-depletion effects.

In a typical transistor manufacturing process, dopants are introduced into a polysilicon film to improve the conductivity, reduce the resistance, and modulate the depletion layer of the gate electrode, thereby improving the speed of the transistor. These dopants diffuse throughout the polysilicon film primarily along the grain boundaries. Consequently, the higher the grain boundary density of a film, the better the diffusion of dopants through the film. As shown in FIG. 2, the large grain size of polysilicon film 21 reduces the grain boundary density of the film, thereby reducing the diffusion of dopant material through the film. As a result, a poly-depletion effect occurs wherein the poor conductivity and high resistance of the polysilicon film nearest the gate oxide boundary hinders the performance of the transistor. In addition, because the polysilicon film 21 is deposited at a low temperature, the deposition rate is similarly low, resulting in slow throughput times.

Figure 3A:
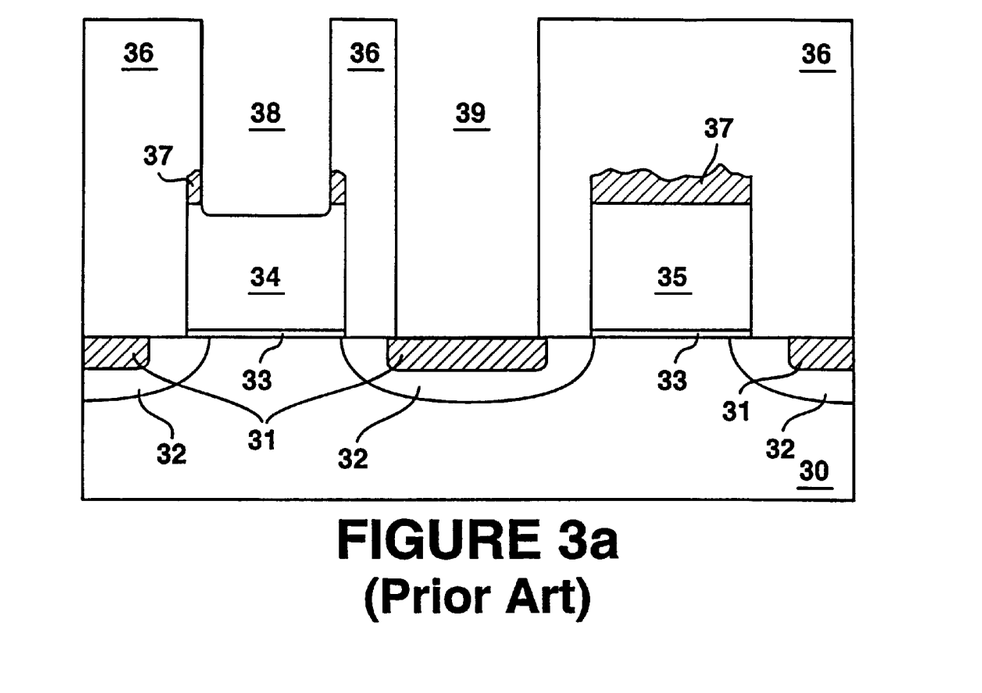
FIG. 3a is a cross-section of insulated transistors formed on a semiconductor substrate after contacts have been etched.

FIG. 3a is a cross-section of insulated transistors formed on a semiconductor substrate after the contact etch has been performed. Polysilicon gate electrodes 34 and 35 are formed over gate oxide films 33 on silicon substrate 30. Source/drain regions 32 are formed in the silicon substrate and silicide regions 31 and 37 are formed to reduce the resistance of the silicon. Dielectric layer 36 is deposited over the surface of the substrate and contact regions 38 and 39 are subsequently etched through dielectric film 36 to contact polysilicon gate electrode 34 and source/drain region 32, respectively.

Note that gate electrodes 34 and 35 have been made very thick. This has been done to minimize the likelihood that an implanted dopant will channel through the polysilicon film and implant itself into gate oxide 33. As a result of the large thickness of gate electrodes 34 and 35, the aspect ratio between these features is high, resulting in problems associated with adequately filling the region between the electrodes with dielectric material 36. In addition, the resulting high aspect ratio of contact opening 39 frustrates contact filling by a subsequently deposited metal plug.

In a typical etch process, the etch selectivity of dielectric layer 36 to polysilicon gate electrode 34 is not infinite. In practice, the etch chemistry used to etch contact openings 38 and 39, will also etch gate electrode 34 at a slower rate. Because the distance between the surface of gate electrode 34 and the surface of silicon substrate 30 is great, it takes a long time to fully etch dielectric 36 from region 39 after the silicide cap 37 of polysilicon gate electrode 34 is reached within region 38. During this time, the etch chemistry eats through silicide 37 and into the underlying polysilicon film of gate electrode 34. As a result, the contact resistance between a metal plug subsequently deposited into region 38 and gate electrode 34 is significantly increased because the low resistance silicide cap 37 has been entirely eaten away. This results in poor device performance.

Figure 3B:
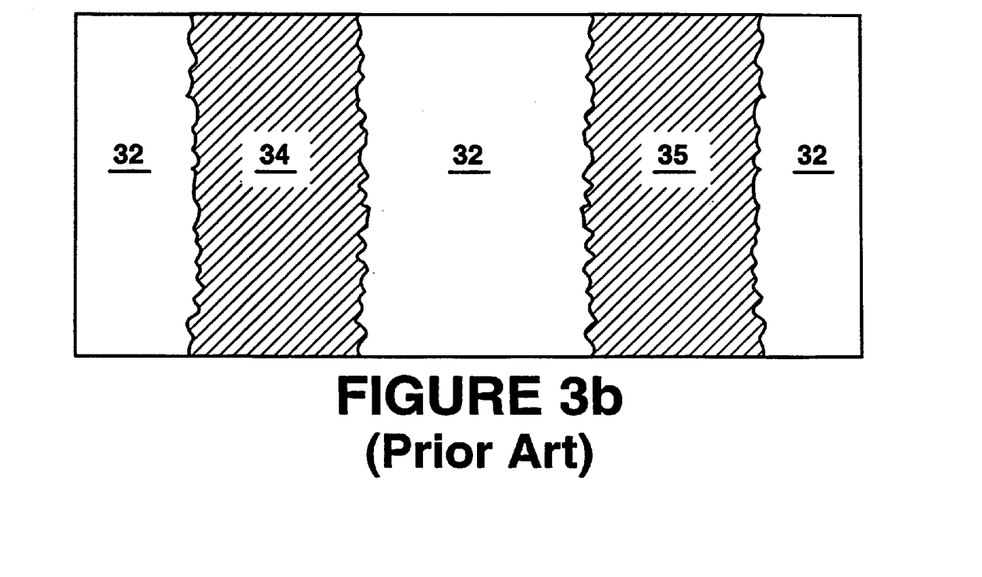

FIG. 3b is a top-down view of FIG. 3a showing the poor edge definition of silicon gate electrodes 34 and 35 resulting from the rough surfaces of the polysilicon film of FIG. 1. Note that given the poor edge definition shown in FIG. 3b, precise characterization of the resulting transistors is made nearly impossible, and there is a large variation in transistor channel length, resulting in variations of speed of the transistor. In addition, the punch-through performance of the resulting transistors is significantly degraded.

What is desired is a polysilicon film which exhibits improved edge definition while still providing good dopant diffusion through the film. In addition, by reducing the channeling effects associated with implanting such a film, the performance and scalability of devices formed using the film can be significantly improved.

SUMMARY OF THE INVENTION

A film primarily comprising silicon crystal grains having a random crystal structure is described. The average size of the grains is within the range of approximately 50 Å to 500 Å.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which:

FIG. 3b is a top-down diagram of the substrate shown in FIG. 3a.

FIG. 7b is a top-down diagram of the substrate shown in FIG. 7a.

DETAILED DESCRIPTION

A microcrystalline silicon film and its fabrication process which overcomes the deficiencies of the prior art is described. In general, in accordance with the present invention, a microcrystalline silicon film is formed, having a small grained, random microstructure which enhances the diffusion of dopants through the film to improve the electrical characteristics of a transistor formed therefrom. In addition, the small grain sizes of the crystal grains within the microcrystalline silicon film (on the order of approximately 150 Å) aids in providing a planar surface to support improved photolithographic processing for better edge definition and additionally impedes the channeling of implanted dopant species.

A transistor utilizing this microcrystalline structure is formed by placing a substrate upon which a gate oxide film has been formed into a deposition chamber. At a temperature of approximately 620° C. $SiH_4$ and HCL is introduced to the deposition chamber. The chamber itself is a low pressure chemical vapor deposition (LPCVD) chamber and the amount of chlorine introduced into the chamber is approximately 1% or less of the amount of silicon introduced into the chamber. As a result, a microcrystalline silicon film is formed on the gate oxide under these conditions. The microcrystalline silicon film is subsequently patterned and a transistor is formed using more conventional processing steps. The minimization of channeling associated with the microcrystalline silicon film permits a practitioner to greatly reduce the thickness of the film from which the gate electrode of the transistor is formed.

A microcrystalline silicon structure and its fabrication process will be described in more detail below along with an implementation in which the microcrystalline structure is used to form the gate electrode of a transistor on a semiconductor substrate.

Figure 4:
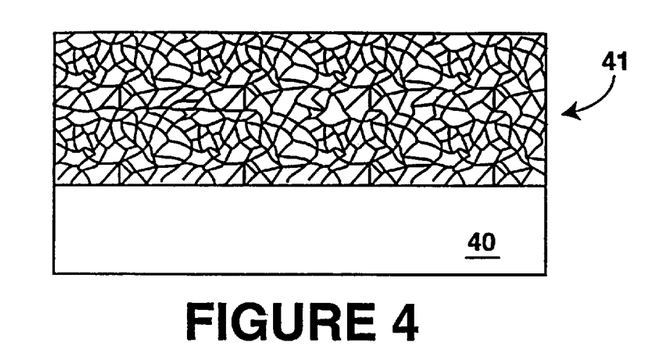
FIG. 4 is a magnified cross-section of a polysilicon film formed in accordance with the present invention on a substrate.

FIG. 4 shows a magnified cross-section of a film formed in accordance with the present invention. Because the silicon crystal structures of this film are much smaller than the crystal structures associated with prior polysilicon films, a film formed in accordance with the present invention is referred to as a microcrystalline silicon film (microsilicon). Microsilicon film 41 is formed on substrate 40. Note the small grained random crystal structure of microsilicon film 41. The size of the crystal grains within microsilicon film 41 is controlled by adjusting the ratio of chlorine to silicon in the reactant gas mixture of the deposition chamber in which the film is formed. For one embodiment of the present invention, the average size of the crystal grains within the microsilicon film are within the range of approximately 100 Å to 400 Å. The size of a grain within the microsilicon film is defined as the average diameter of the grain. For another embodiment of the present invention, the size of the majority of grains within the microsilicon film are all less than approximately 300 Å. For yet another embodiment of the present invention, the average grain size is within the range of approximately 50 Å to 500 Å.

The decrease in grain size of microsilicon films over conventional polysilicon films may be explained by the conversion of the main surface reactive species from Si* adatoms to $SiCl_2$* adatoms when Cl is present. In conventional polysilicon films, the high surface diffusion rate of Si* adatoms prevails over the nucleation rate, resulting in large grain size and growth rate. In contrast, it is believed that the relatively larger and less mobile $SiCl_2$* adatoms exhibit a slower diffusion rate, resulting in a slower grain growth rate, but does not affect the nucleation rate. Consequently, the nucleation rate prevails over the diffusion rate and results in small grain size but with a slower deposition rate.

Note that in accordance with an embodiment of the present invention, the grain boundary density of the microsilicon film is greatly increased as a result of the significant reduction in grain size of the microsilicon film as compared to the large columnar grains of FIG. 1, or the large equi-axed grains of FIG. 2. As previously discussed, dopant species used to dope a polysilicon film primarily diffuses through the polysilicon film along grain boundaries. Because the grain boundary density of microsilicon film 41 is significantly greater than, for example, the grain boundary density of polysilicon film 21 of FIG. 2, the diffusion of dopant species through the structure of microsilicon film 41 is much improved. Dopants introduced near the surface of microsilicon film 41 can readily diffuse along the high density of grain boundaries throughout the microsilicon film. As a result, the dopant concentration throughout the microsilicon film, and hence the microsilicon film conductivity, is much more uniform as compared to the recrystallized amorphous silicon film of FIG. 2.

In accordance with an embodiment of the present invention in which the microsilicon structure is implemented as a transistor gate electrode, poly-depletion effects are minimized by the improved grain boundary density. In other words, more dopant material is found toward the bottom of the microsilicon film, near the gate oxide interface, than is found in the same region of a similarly doped, recrystallized, amorphous polysilicon film. The resulting reduction in resistance (or, alternatively, the increase in conductivity) near the gate oxide interface of the microsilicon gate electrode serves to improve the electrical performance of the transistor, including increasing the switching speed.

In addition to the reduction of the average grain size of a microsilicon film, the surface of the microsilicon film exhibits a much more planar surface than is achieved by the conventional polysilicon film of FIG. 1. Minimization in grain size of a microsilicon film formed in accordance with the present invention has been observed to have a smoothing affect on the surface of the film. In other words, as the parameters of the microsilicon film formation process are adjusted to increase or decrease the average grain size of the film, the surface roughness of the film is similarly increased or decreased respectively. By smoothing the surface of the microsilicon film, variation in intergranular resist thickness is reduced while the reflectivity of the film during the photolithographic patterning process is more uniform as compared to the conventional polysilicon film of FIG. 1. As a result, the microsilicon film exhibits improved edge definition, resulting in improved transistor performance.

While conventional microsilicon films provide an root-mean-square (RMS) roughness of approximately 75 Å as measured by an atomic force microscope (AFM), for one embodiment of the present invention, a microsilicon film exhibits an RMS roughness within the range of approximately 5 Å to 50 Å. For another embodiment of the present invention in which the grain size of the microsilicon film is further reduced, the film exhibits an RMS roughness factor within the range of approximately 5 Å to 20 Å. This represents a reduction in the surface roughness of greater than 70% over a conventional polysilicon film.

Figure 5:
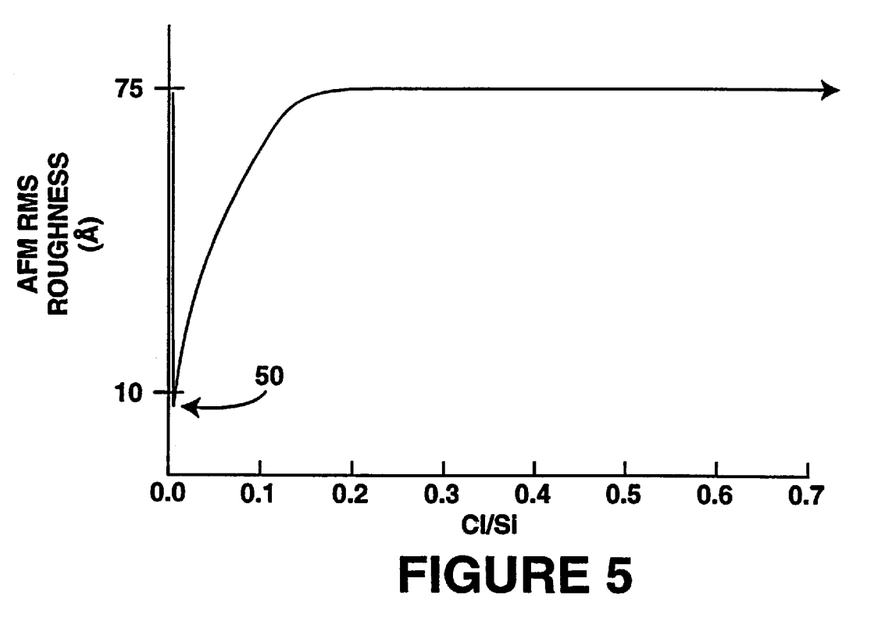
FIG. 5 is a graph showing roughness versus the Cl/Si ratio of a polysilicon film formed in accordance with the present invention.

FIG. 5 shows a graph of AFM RMS roughness versus the ratio of chlorine atoms to silicon atoms in the reactant gases within the microsilicon deposition chamber. Note that spike 50 shown in the graph determines the point at which the chlorine to silicon ratio provides the smoothest surface of the microsilicon film. While the precise ratio of chlorine-to-silicon corresponding to point 50 is not currently known, it is believed to reside slightly below approximately 0.01 (1%). Note that if the chlorine-to-silicon ratio is too high, above approximately 0.15, or 15%, the advantages of adding chlorine into the deposition chamber is lost. In addition, it should be noted that adding chlorine to the reactant gas inside a microsilicon deposition chamber significantly and rapidly reduces the deposition rate of the microsilicon film. Therefore, in accordance with the present invention, the chlorine-to-silicon ratio within the deposition chamber is balanced to provide the fastest deposition rate while minimizing the roughness of the microsilicon film.

For one embodiment of the present invention, the ratio of chlorine to silicon used to form the microsilicon film is in the range of approximately 0% to 10%. This range is exclusive of 0% and inclusive of 10%. For another embodiment of the present invention, the chlorine-to-silicon ratio range extends up to 5%. For yet another embodiment, the chlorine-to-silicon ratio of the reactant gases used to form the microsilicon film is less than approximately 1%.

For one embodiment of the present invention, to achieve the desired chlorine-to-silicon ratio within the deposition chamber, the flow rate of a silicon-containing reactant gas is adjusted to introduce the appropriate amount of silicon into the chamber. Similarly, the flow rate of a chlorine-containing reactant gas is adjusted to introduce the appropriate amount of chlorine into the chamber. For example, for an embodiment in which the gas comprising silicon is silane, $SIH_4$, the gas comprising chlorine is HCl, and a 1% chlorine to silicon ratio is desired, the flow rate of HCL into the deposition chamber is adjusted to be 1% of the flow rate of silane into the deposition chamber. For example, for one embodiment of the present invention, silicon is introduced into the deposition chamber at a flow rate in the range of approximately 100 to 1000 sccm while chlorine is introduced into the deposition chamber at a flow rate in the range of approximately 1 to 10 sccm to achieve a chlorine-to-silicon ratio of one percent. For another embodiment, the flow rate of chlorine into the deposition chamber is in the range of approximately 2 to 20 sccm to achieve a chlorine-to-silicon ratio of approximately two percent.

For other embodiments of the present invention, other silicon-containing and chlorine-containing species are combined in the deposition chamber to form the microsilicon film. For example, in one embodiment, trichloroethylene (TCE) or trichloroethane (TCA) are the species used to introduce chlorine into the deposition chamber. However, since both TCE and TCA deliver three chlorine atoms per molecule, the flow rates of these species are appropriately scaled. For example, for an embodiment in which silicon is introduced via a silane carrier and chlorine is introduced via a TCA carrier, and a chlorine-to-silicon ratio of approximately 1% is desired, a flow rate of silane of approximately 300 sccm in conjunction with a flow rate of TCA of approximately 1 sccm into the deposition chamber will provide the desired result. Other chemical species which may be used in accordance with other embodiments of the present invention to deliver chlorine into the deposition chamber include $SiH_3CL$, $SiH_2CL_2$, $SiHCL_3$, $SiCL_4$, dichloroethylene (DCE), or other organic chemicals.

In accordance with an embodiment of the present invention, the deposition chamber used to deposit the microsilicon film is a LPCVD system maintaining a pressure within the range of approximately 1–500 pascal during the microsilicon film deposition process. For other embodiments of the present invention, lower pressures may be employed, however, the deposition rate of the microsilicon film is reduced with a reduction in pressure, thereby slowing the deposition throughput time and reducing the manufacturability of the process. Alternatively, for other embodiments of the present invention, higher pressures are implemented, up to and including atmospheric pressures in, for example, atmospheric chemical vapor deposition (APCVD) systems. While higher pressures tend to raise the deposition rate of the microsilicon film, resulting in better process throughput, the high pressures tend to deposit microsilicon films having poor uniformity across the surface of the substrate.

In accordance with an embodiment of the present invention, the excitation energy provided within the deposition chamber during the formation of the microsilicon film is thermal energy at a temperature in a range of approximately 580° C. to 700° C. For an alternate embodiment of the present invention, the temperature within the deposition chamber is in the range of approximately 500° C. to 800° C. during the formation of the microsilicon film. However, it should be noted that the deposition rate of microsilicon films formed at temperature below 580° C. is less than approximately 50 Å per minute, making such processes slow enough to be nearly unmanufacturable. In addition, note that films formed in accordance with the present invention at temperatures below approximately 560° C. will tend to form amorphous silicon films which must subsequently be recrystallized at temperatures in excess of 600° C. Also, for other embodiments in which temperatures in excess of approximately 700° C. are applied during the microsilicon film deposition process, gas phase reactions may occur leading to rough and loosely adhering films. For other embodiments, the excitation energy provided to the reactant species in the deposition chamber is RF energy provided in conjunction with a plasma enhanced chemical vapor deposition (PECVD) process.

Figure 6:
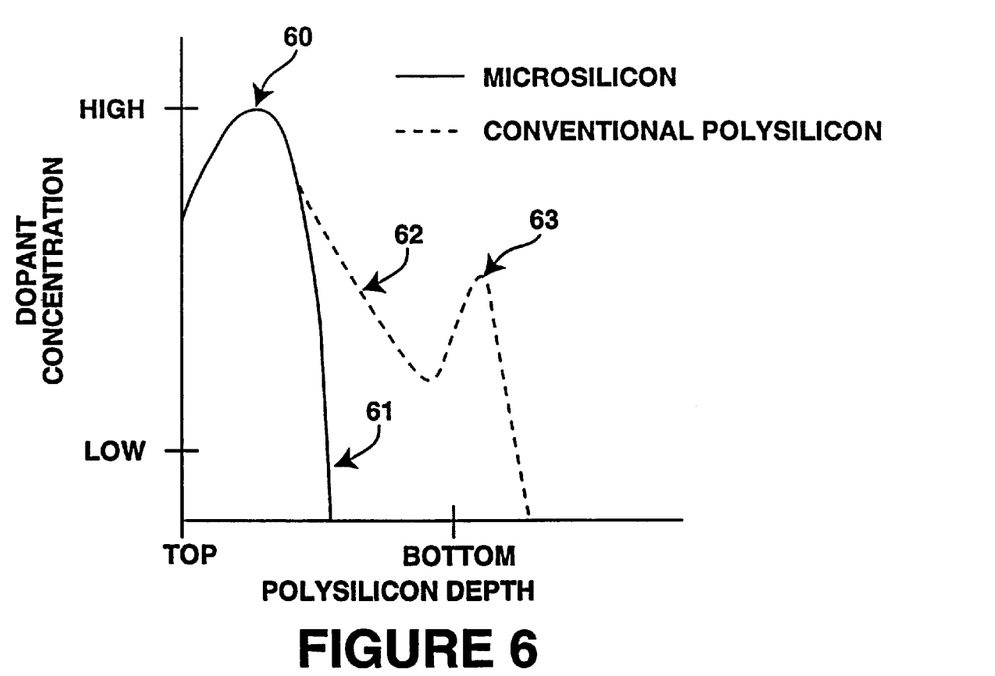
FIG. 6 is a graph showing dopant concentration versus depth into polysilicon films.

FIG. 6 shows a graph of dopant concentration in a microsilicon film versus depth into the microsilicon film for an implanted dopant species. For purposes of comparison, the graph of FIG. 6 includes both curve 61, associated with a microsilicon film formed in accordance with the present invention, and curve 62, associated with a more conventional polysilicon film. Both films were implanted with a dopant species at the same dose and energy. Peak 60 is approximately the same for both curve 61 and 62. The height of peak 60 is associated with the peak dopant concentration within the films. The height of peak 60 is modulated by adjusting the implant dosage. The depth within the film at which peak 60 occurs is modulated by adjusting the implant energy. Note the relatively smooth, nearly Gaussian distribution of dopants shown by curve 61 which is associated with a microsilicon film formed in accordance with the present invention. Judging from this graph, there is no evidence that any implant channeling occurs within the microsilicon film.

In contrast, the dopant curve 62 associated with a conventional polysilicon film exhibits a significant tail breaking off from the Gaussian distribution of curve 61. This tail is attributed to the severe channeling which takes place in conventional polysilicon films. As a result of this channeling, a secondary peak 63 occurs near the interface of the polysilicon film and the underlying oxide layer where the majority of the channeled dopant species are ultimately implanted into the oxide layer, and pile up near its surface.

As previously discussed, in applications in which a polysilicon film is used for the gate electrode structure of a transistor, channeling through the polysilicon film by implanted dopants which eventually become implanted into the underlying gate oxide degrades the performance and reliability of the transistor. Therefore, in accordance with prior art transistor fabrication processes using conventional polysilicon gate electrode structures, the polysilicon must be very thick to protect the underlying gate oxide layer from being implanted by channeled dopants. However, in accordance with the present invention, it can be seen from the graph of FIG. 6 that the thickness of a microsilicon gate electrode having the small grained random structure of the present invention can be drastically reduced. This can be achieved because a microsilicon film practically eliminates the occurrence of channeling. The minimization of the thickness of microsilicon films formed in accordance with the present invention provides significant advantages to the manufacturer of integrated circuit devices. Note that for alternate embodiments of the present invention, the microsilicon film is doped in another manner, such as during deposition or by diffusion from a solid source.

Figure 7A:
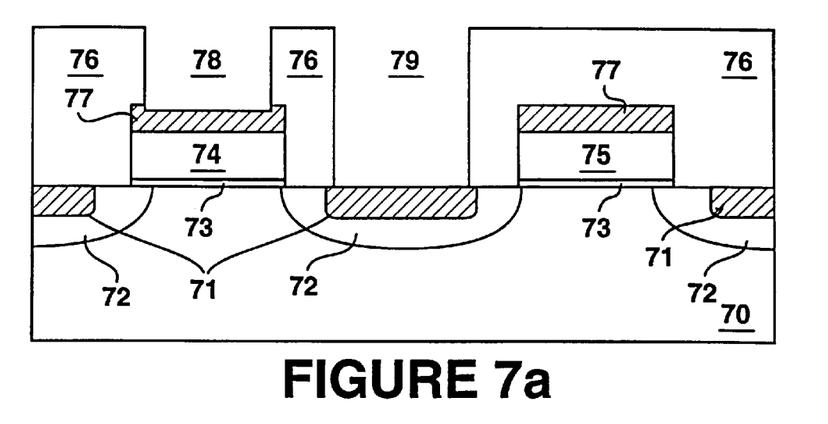
FIG. 7a is a cross-section of insulated transistors formed in accordance with the present invention on a semiconductor substrate after contacts have been etched.

Some of these advantages are described below in conjunction with FIG. 7A. FIG. 7A shows a cross-section of insulated transistors formed in accordance with the present invention on a semiconductor substrate after contacts have been etched through the insulating material. The structure shown in FIG. 7A is created by first forming an oxide layer 73 on the surface of semiconductor substrate 70. Next, a microsilicon film formed in accordance with the present invention is deposited onto the surface of the oxide layer. The microsilicon film is subsequently patterned and etched to form the transistor gate electrode structures 74 and 75. Source/drain regions 72 are then formed by implanting dopants into semiconductor substrate 70 or by diffusion from a solid source. The microsilicon gate electrode structures 74 and 75 are also implanted or otherwise doped. Next, in conjunction with spacer technology, silicide regions 71 of semiconductor substrate 70 and silicide caps 77 of microsilicon gate electrode structures 74 and 75 are formed. The silicide regions significantly reduce the surface resistance of their respective regions. Then a dielectric layer 76 is deposited over the surface of the substrate and contact regions 78 and 79 are subsequently etched through dielectric film 76 to contact microsilicon gate electrode 74 and source/drain region 72 respectively.

Comparing FIG. 7A to FIG. 3A of the prior art, the advantages of reduced polysilicon thickness of the respective gate electrode structures are readily apparent. First, because the height of transistor gate electrodes 74 and 75 are dramatically reduced over the prior art, the aspect ratio between these gate electrodes is similarly reduced. As a result, when dielectric layer 76 is subsequently formed over the surface of the substrate to passivate the underlying components, the gap between gate electrode 74 and 75 is more easily and substantially filled by the dielectric film. In addition, contact opening 79, which is then etched through dielectric layer 76 between the gate electrodes also has a significantly reduced aspect ratio. Consequently, the conductive material subsequently formed over the surface of the substrate can more easily and reliably fill the lower aspect ratio contact opening 79 to create a better plug contact to the underlying source/drain region.

For an alternate embodiment of the present invention in which the microsilicon film is implemented in conjunction with an erasable programmable read only memory (EPROM) process, the reduction in microsilicon thickness may be found particularly advantageous. This is because EPROM structures generally double-up polysilicon layers to create both floating and control gates of the transistor. This results in more significant problems associated with the more severe aspect ratios between adjacent, dual-layer polysilicon lines. Therefore, microsilicon films formed in accordance with the present invention can provide great benefits to EPROM devices, such as, for example, flash and EEPROM, by reducing these aspect ratios.

For alternate embodiments, semiconductor devices which employ conventional polysilicon films for other applications can greatly benefit from microsilicon films formed in accordance with the present invention. For example, devices which use polysilicon as interconnect lines, interconnect contacts, interconnect vias, resistors, trench fill material, or capacitor electrodes can greatly benefit by replacing the polysilicon with microsilicon. Even devices which currently utilize alternate conductive films, such as refractive metals, may be improved by replacing these materials with microsilicon films. Other devices which can benefit include DRAM and SRAM devices.

In addition to the advantages associated with improved topography and reduced aspect ratios, for one embodiment of the present, minimization of the thickness of gate electrode structures eliminates prior art problems associated with etch selectivity between the dielectric film and transistor gate electrodes during the contact etch process. For example, as shown in FIG. 7A, contact openings 78 and 79 are etched through dielectric layer 76 to contact the gate electrode structure 74 and source/drain region 71 respectively. It can be seen that the contact etch will reach the gate electrode structure 74 through contact opening 78 before it will reach the source/drain region 71 through contact opening 79. Because the etch selectivity is not infinite, some portion of the gate electrode structure 74 will be etched at a slow rate while the remainder of dielectric layer 76 is cleared from contact opening 79 before reaching source/drain region 71.

Because the height of gate electrode 74 is significantly reduced over the prior art, once contact opening 78 reaches the surface of cap silicide 77 of gate electrode 74, contact opening 79 does not have much further to etch before reaching source/drain region 71. The time delay between contact opening 78 reaching gate electrode 74 and contact opening 79 reaching source/drain region 71 is small enough such that the etch chemistry does not have enough time to eat through the silicide cap of gate electrode 74. As a result, the conductive contact plug, which is subsequently formed within contact opening 78, will make a good, low resistance electrical connection to silicide cap 77 of gate electrode 74, thereby improving speed and reliability of the device.

For one embodiment of the present invention, the thickness of a microsilicon film which will be implemented as the gate electrode of a transistor is in the range of approximately 500 Å to 1500 Å. Note that this thickness is less than 30% of the thickness of more conventional polysilicon films which are similarly implemented as transistor gate electrodes. For another embodiment of the present invention, a microsilicon film is deposited to a thickness within the range of approximately 100 Å to 2000 Å or 1000 Å to 3000 Å.

Figure 7B:
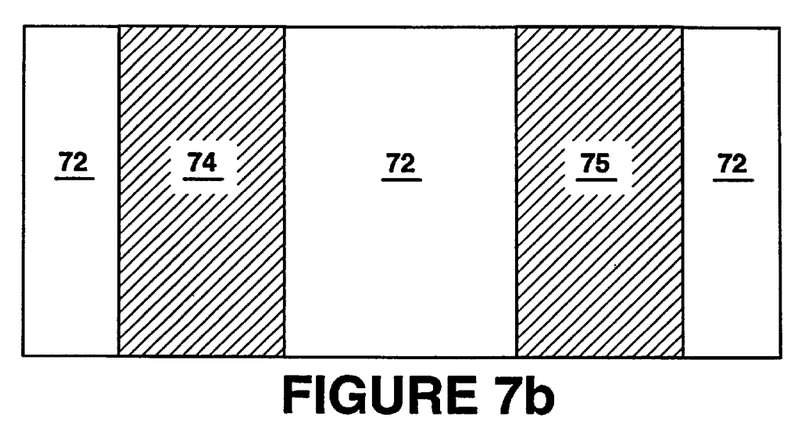

FIG. 7b shows a top-down view of the substrate shown in FIG. 7a. As can be seen, the edge definition of gate electrodes 74 and 75 is vastly improved over the prior art process illustrated in FIG. 3b. This improvement in edge definition serves to improve the punch-through performance and to reduce the variation in channel length and, thus, the speed of transistors fabricated in accordance with the present invention. As a result, the width of microsilicon lines formed in accordance with the present invention can be reliably scaled well below 0.3 microns, thereby reducing the minimum channel length of transistors, resulting in increased speed and device packing density.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A transistor formed on a semiconductor substrate, the transistor comprising a microsilicon film as a gate electrode of the transistor and having a thickness in the range of approximately 100 Å to 1400 Å, the microsilicon primarily comprising a plurality of randomly oriented and randomly sized crystal grains, an average size of the grains being within the range of approximately 100 Å to 400 Å, the transistor being a self-aligned metal-oxide-semiconductor transistor.

* * * * *